(12) United States Patent
Pascucci

(10) Patent No.: US 6,580,637 B2
(45) Date of Patent: Jun. 17, 2003

(54) SEMICONDUCTOR MEMORY ARCHITECTURE

(75) Inventor: Luigi Pascucci, Sesto San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/972,769

(22) Filed: Oct. 5, 2001

(65) Prior Publication Data

US 2002/0067640 A1 Jun. 6, 2002

(30) Foreign Application Priority Data

Oct. 6, 2000 (IT) .......................... MIA002165

(51) Int. Cl.[7] .............. G11C 16/04; G11C 8/00
(52) U.S. Cl. ............... 365/185.11; 365/230.04
(58) Field of Search .............. 365/185.11, 230.04, 365/230.08, 185.23, 233

(56) References Cited

U.S. PATENT DOCUMENTS 6,021,077 A * 2/2000 Nakaoka ............... 365/189.04
6,259,627 B1 * 7/2001 Wong ................... 365/185.03
6,356,506 B1 * 3/2002 Ryan .......................... 365/233

* cited by examiner

Primary Examiner—Richard Elms
Assistant Examiner—Anh Phung
(74) Attorney, Agent, or Firm—Lisa K. Jorgenson; E. Russell Tarleton; Seed IP Law Group PLLC

(57) ABSTRACT

A semiconductor memory architecture having two memory banks each containing respective memory locations, and for each memory bank, respective circuits for selecting the locations of the bank and respective circuits for reading the data contained in the selected locations of the bank, a structure for the transfer of the data read by the reading circuits associated with the memory banks to data output terminals of the memory, there being a single data-transfer structure assigned selectively to one memory bank at a time and which includes storage for storing the most recent datum read by the reading circuits, and output driver circuits activated selectively in order to transfer the contents of the registers to the data output terminals of the memory, an addressing structure having, for each memory bank, and a respective circuit for the sequential scanning of the memory locations of the bank, operatively connected to the respective circuits for selecting the locations of the memory bank.

22 Claims, 6 Drawing Sheets

SEMICONDUCTOR MEMORY ARCHITECTURE

BACKGROUND OF THE INVENTION

1. Field of the Invention

The present invention relates to the field of semiconductor memories, particularly but not exclusively to non-volatile memories, for example, Flash EEPROM memories (hereinafter referred to as Flash memories).

2. Description of the Related Art

The typical structure of the simplest non-volatile semiconductor memories such as ROMs and EPROMs comprises basically a matrix of memory cells (the memory matrix) in which the cells are arranged in rows ("word lines") and columns ("bit lines"), circuits for decoding an address supplied from the exterior, circuits for selecting the memory cells within the matrix in dependence on the address supplied from the exterior, circuits for reading the contents of the memory cells selected, and output circuits for driving external data lines.

In a conventional non-volatile memory, the sole type of reading access to the memory is random access. The address of the memory location the content of which is to be read is supplied to the memory from the exterior. The decoding circuits and the selection circuits, respectively, decode the address supplied from the exterior and select the memory cells which correspond to that address, that is, they select the rows and the columns. The reading circuits read the contents of the memory cells selected and supply the result of the reading to the output circuits; the datum read in the memory location addressed is placed on the data lines outside the memory.

During random access to the memory, the time required to perform the reading (the memory-access time) is the sum of individual times representative of the durations of the various individual steps which make up the access and datum-extraction process. Basically, these individual steps are: the propagation of the signals along the row and column selection paths, precharging operations, for example, of the columns selected, the step of reading and evaluating the data stored in the memory cells selected, the propagation and transfer of the data read to the output ("buffer") circuits, and the switching thereof.

Each random-access operation involves the execution of all of the above-mentioned individual steps. Precisely for this reason, the access time is quite long or, in any case, is difficult to reduce, even with the use of advanced manufacturing technologies. In particular, the memory-access time for a random reading is longer than the time which is strictly necessary to perform the reading of the content of a memory location.

However, whilst having an access time which is not optimal, the conventional architecture has the advantage that it is straightforward in terms of internal circuit structures and simple from the point of view of the timing (the memory behaves asynchronously), that it can be used relatively easily for the implementation of redundancy structures for "functionally repairing" memory elements which are not operating, and that it has low consumption.

Some producers of integrated circuits have proposed an architecture for nonvolatile memories, particularly ROMs ("Mask ROMs"), which is known in the art as "Page Mode," and which enables performance to be improved in terms of memory-access time. This architecture permits parallel reading of several memory locations (for example, eight bytes or words) in a first reading cycle; the result of the parallel reading of the eight memory locations is stored in a package of a corresponding number of holding registers; the content of a preselected one of the registers of the package is then made available to the exterior.

With this technique, it is possible to scan the eight memory locations read in parallel, the contents of which are stored in the respective registers of the package, within a time significantly less than (approximately half of) the time required to complete a random-access reading. However, the first reading cycle, during which the eight locations are read in parallel, has a duration corresponding to that of a random-access reading. In the best case, therefore, a slower random-access reading is necessarily provided for every eight rapid readings.

Other disadvantages of "page mode" architecture lie in the large number of reading circuits which are required to read the eight locations in parallel (eight times the number normally required), in the high current-absorption during the reading of the eight memory locations in parallel, in the need to provide the package of holding registers, in the need to provide circuits for decoding and selecting the individual registers in the package, and in the management of a memory-reading protocol which provides for a double cycle time ("random" and "page mode"). Moreover, in comparison with conventional architecture "page mode" architecture reduces the efficacy of the redundancy structures. In fact, it is very difficult and, in any case, extremely complex from the point of view of the resulting structure, to provide for the capability to select several redundancy rows or columns simultaneously, which would be necessary if, amongst the eight memory locations to be read in parallel, there were some which belonged to two or more different defective lines or to two or more different defective columns.

BRIEF SUMMARY OF THE INVENTION

The disclosed embodiments of the present invention provide a memory architecture that enables the reading performance of the memory to be improved in comparison with conventional architectures, whilst reducing the disadvantages of "page mode" architecture.

According to an embodiment of the present invention, a semiconductor memory architecture comprising two memory banks each containing respective memory locations is provided. The architecture includes:

for each memory bank, respective circuits for selecting the locations of the bank and respective circuits for reading the data contained in the selected locations of the bank, a structure for the transfer of the data read by the reading circuits associated with the memory banks to data output terminals of the memory, there being a single data-transfer structure that can be assigned selectively to one memory bank at a time and which comprises storage means for storing the most recent datum read by the reading circuits, and output driver circuits that can be activated selectively in order to transfer the contents of the registers to the data output terminals of the memory, an addressing structure comprising, for each memory bank, a respective circuit for the sequential scanning of the memory locations of the bank, operatively connected to the respective circuits for selecting the locations of the bank, first circuit means for initializing the sequential scanning circuits by means of an address supplied from outside the memory and corresponding to an origin location, the first circuit means being sensitive to a first control signal from outside the memory and indicative of the presence of the address corresponding to the origin location, second circuit means for bringing about a selective updating of the sequential scanning circuits so as to bring about, starting from the origin location, sequential access to further locations addressed by the addressing structure by accessing the memory banks alternately, by an interleaved method, third circuit means for managing the reading circuits of the two memory banks in accordance with the interleaved method so that two reading processes are executed contemporaneously, but suitably offset in time, in the two memory banks, fourth circuit means for bringing about the selective assignation of the data-transfer structure to the memory bank currently being accessed, in accordance with the interleaved method, and an internal timing structure for controlling the first, second, third, and fourth circuit means, the data-transfer structure, and the addressing structure, in accordance with second control signals from outside the memory.

BRIEF DESCRIPTION OF THE SEVERAL VIEWS OF THE DRAWINGS

The characteristics and the advantages of the present invention will become clearer from the following detailed description of a possible practical embodiment thereof, illustrated purely by way of non-limiting example in the appended drawings, in which.

DETAILED DESCRIPTION OF THE INVENTION

Figure 1:
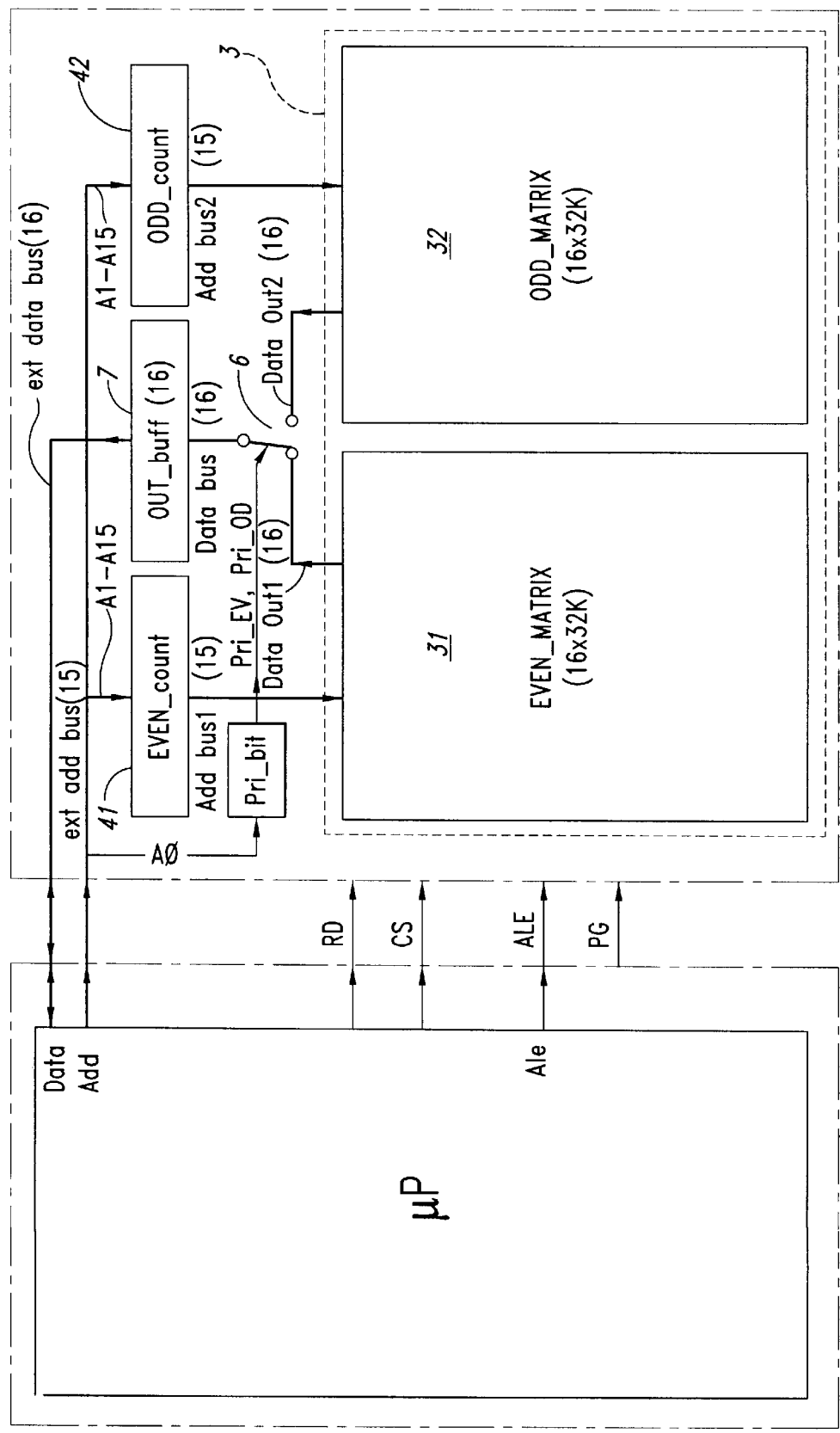
FIG. 1 is a simplified, block diagram of an electronic system which includes a memory with architecture according to the present invention.

With reference to the drawings and, in particular, to FIG. 1, this shows a simplified block diagram of an electronic system which includes a microprocessor ($\mu$P) 1 operatively connected to a memory 2 having an architecture according to the present invention.

The memory, for example, a flash memory, comprises a memory matrix 3 divided into two substantially independent half-matrices or memory banks 31 (EVEN_MATRIX), 32 (ODD_MATRIX) in each of which memory cells (for example, floating-gate MOS transistors) are arranged in rows and columns, in known manner. For example, each of the two memory banks contains $2^{15}$ (32K) sixteen-bit memory words.

In FIG. 1, each of the two blocks 31, 32 should be understood to include, in addition to the respective half-matrix of memory cells, also respective circuits for decoding addresses and consequently selecting the locations of the memory bank, as well as respective circuits (for example, so-called "sense amplifiers") for reading memory cells belonging to the memory location selected.

According to the present invention, the memory has an internal addressing structure. The internal addressing structure comprises, for each memory bank 31, 32, a respective counter 41 (EVEN_count), 42 (ODD_count) which receives input lines A1–A15 from an address-signal bus ext_Add_bus. The lines of the address-signal bus ext_Add_bus are connected to respective input terminals of the memory 2 which in turn are connected to output terminals Add of the microprocessor 1 by means of line bus outside the memory. The microprocessor 1 supplies to the memory 2, by means of the outputs Add and the bus, addresses (random addresses) of memory locations the contents of which are to be read. More particularly, in the example mentioned, in which each of the two memory banks 31, 32 contains 32K memory words each of sixteen bits, in order to address the locations of the memory 2, the number of lines of the bus by means of which the microprocessor 1 supplies to the memory 2 the address signals of the locations to be read is equal to $2*2^{15}=2^{16}$. Of these, fifteen lines A1–A15 supply the inputs of the counters 41, 42, whilst one line A0, in particular, the line which carries the signal corresponding to the least significant bit (LSB) of the address, supplies an input of a circuit 5 which, as will be explained further below, enables a selection to be made between the two memory banks 31, 32.

Each counter 41, 42 supplies at its output a respective bus Add_bus1, Add_bus2 of lines for address signals within the memory and the lines of the respective buses Add_bus1, Add_bus2 are fed to the respective memory bank 31, 32. The decoding and selection circuits associated with the respective memory bank 31, 32 perform a decoding of the address carried by the respective bus Add_bus1, Add_bus2 in order to identify and consequently to select the memory location of the bank 31, 32 which corresponds to that address signal. For each address supplied by the microprocessor 1 to the memory 2, two memory locations are thus identified, one belonging to the bank 31 and the other to the bank 32.

The circuit 5 controls an array of switches 6 by means of output signal lines Pri_EV, Pri_OD of the circuit 5. The switches 6 enable lines (sixteen lines in the example mentioned) of an internal bus Data_bus of the memory to be connected alternatively to one or to the other of the two buses Data_Out1, Data_Out2 of data output lines which are supplied as outputs by the reading circuits of the banks 31, 32, respectively. The bus Data_bus supplies inputs of output buffers 7 (OUT_buff, sixteen lines in the example given). The output-buffer circuits 7 drive lines (sixteen lines in the example given) of a bus Ext_Data_bus which are connected to bidirectional input/output data terminals of the memory and, by means of a bus of bidirectional lines outside the memory, to respective bidirectional data input/output terminals Data of the microprocessor 1.

In addition to the address signals, the microprocessor 1 also supplies control signals RD, CS, ALE and PG to the memory 2 by means of respective lines. When the signal CS ("Chip Select") is turned on by the microprocessor 1, it brings about enablement of the memory 2; when it is not turned on, however, it causes the memory to be put in the "standby" condition. When the signal ALE ("Address Latch Enable") is turned on, it informs the memory 2 that the microprocessor 1 has placed on the address-signal bus lines a new address of a location of the memory the content of which it to be read. The signal RD ("ReaD") times the operations of the reading and the engagement of the data bus outside the memory by the memory 2, in the manner which will be explained further below. The signal PG ("ProGram") controls operations for the programming of new data in the memory 2.

Figure 2:
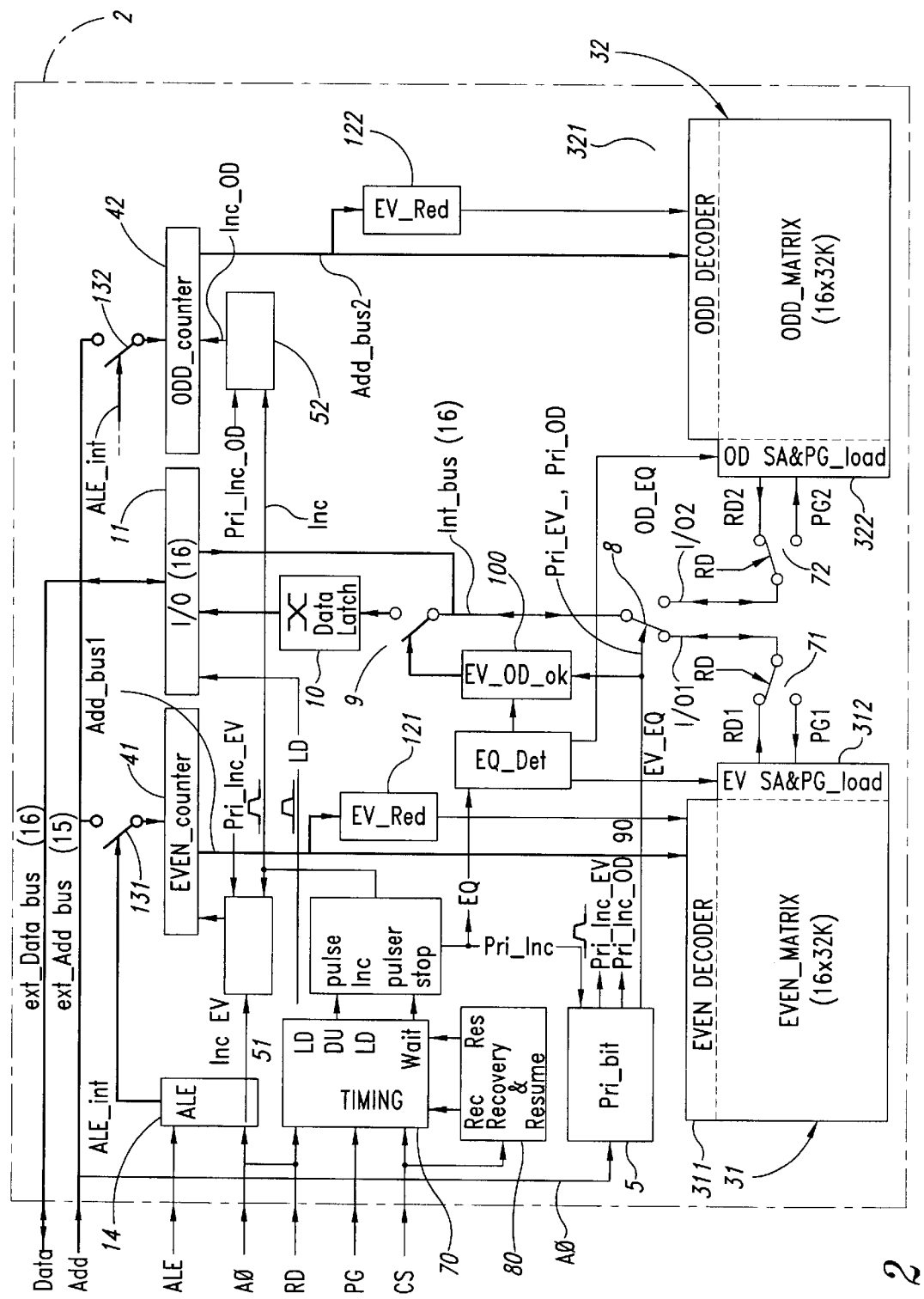
FIG. 2 is a more detailed block diagram of the memory of FIG. 1, FIGS. 3A and 3B illustrate schematically the operation of the memory of FIGS. 1 and 2 in a reading method peculiar to the architecture according to the present invention.

With reference now to the more detailed diagram of the memory 2 shown in FIG. 2, some of the blocks already shown in FIG. 1, in particular, the two memory banks 31, 32 and the two counters 41, 42, can be recognized therein. Also shown explicitly, although at block level, are circuits 311 (EVEN Decoder), 321 (ODD Decoder) for decoding and selecting the memory locations of the two memory banks 31, 32, respectively, which circuits 311 and 321 receive the bus lines ADD__bus1, Add__bus2, respectively, and circuits 312 (EV SA and PG__Load), 322 (OD SA & PG__Load) for the reading of the memory cells belonging to the memory location selected in the respective bank or for the programming of new data in the memory cells belonging to the memory location selected in the respective bank. The reading circuits, which should be understood as being contained in the blocks 312 and 322, supply at their outputs respective buses (RD1, RD2) of lines (sixteen lines in the example given); respective input lines of respective buses PG1, PG2, on the other hand, are connected to the programming circuits contained in the blocks 312 and 322. Respective arrays of switches 71, 72, controlled by the signal RD or by a signal derived therefrom, enable the lines of the output buses RD1, RD2 of the reading circuits, or the lines of the input buses PG1, PG2 to the programming circuits to be connected selectively to respective bidirectional lines of respective buses I/O1, I/O2. The two buses I/O1, I/O2 are connectible selectively, by means of an array of switches 8, controlled by the signals Pri__EV, Pri__OD, to a bus of bidirectional lines Int__bus. The lines of the bus Int__bus are connectible selectively, by means of an array of switches 9 (for example, transfer gates), to inputs of an array of bistable elements (data latches) 10 for the temporary storage of the datum read in the memory location addressed. The outputs of the latches 10 are connected to inputs of an array of output circuits ("output buffers", block 11) for driving the lines of the bus ext__Data__bus. In parallel, the lines of the bidirectional bus Int__bus are also connected to outputs of input circuits ("input buffers", block 11) which receive the data to be programmed in the memory cells from the lines of the bus ext__Data__bus.

Also shown at block level are redundancy circuits 121 (EV__Red), 122 (OD__Red) which are associated with the bank 31 and with the bank 32, respectively, are independent of one another, and receive as inputs the lines of the buses Add__bus 1, Add__bus2, respectively. The redundancy circuits perform a check of the current address present on the lines of the respective bus Add bus1__Add bus2 to check whether it coincides with addresses stored in the redundancy circuits and corresponding to memory locations which belong to the respective bank 31, 32 and which are considered to be defective; if the address currently present on the lines of the bus Add__bus1, Add__bus2 coincides with one of the addresses stored in the redundancy circuits, the redundancy circuits 121, 122 provide for the selection of a redundancy location (row, column, or both) functionally replacing the defective location. Each of the two banks 31, 32 has respective redundancy rows and columns which can be used independently of those of the other memory bank, under the control of the respective redundancy circuit 121, 122. This increases the efficacy of the redundancy structure which enables a defective row or column of one bank to be repaired functionally in a manner which does not affect the other bank.

The two counters 41, 42 receive the lines A1–A15 via respective arrays of switches 131, 132 which are controlled by a signal ALE__int that is generated within the memory 2 by a circuit 14 by deriving it from the external signal ALE. As well as being able to be loaded with an address supplied to the memory 2 from the exterior (that is, from the microprocessor 1) by means of the lines A1–A15 and the switches 131, 132, the two counters 41, 42 can perform an internal scanning of the addresses of the memory locations of the respective banks 31, 32. For this purpose, respective pulsed signals Inc__EV, Inc__OD are supplied to the counters 41, 42 and, upon each pulse, bring about an increment of 1 of the value, in binary code, contained in the respective counter. The signals Inc__EV, Inc__OD are generated under the control of respective conditional increment circuits 51, 52. The two conditional increment circuits 51, 52 receive a common pulsed signal Inc generated under the control of an incrementing circuit 60 (Inc pulser) which generates a pulsed signal, and respective enabling signals Pri__Inc__EV, Pri__Inc__OD which are generated by the circuit 5 (Pri__bit) and which, as will be described further below, in a particular method of operation of the memory, are turned on alternately to permit the increment of the respective counter 41, 42, that is, to permit the generation of a pulse on the signal Inc__EV, Inc__OD, respectively, in synchronism with the pulsed signal Inc. The alternation in the turning-on of the signals Pri__Inc__EV and Pri__Inc__OD is timed by a pulsed signal Pri__Inc, generated by the circuit 60 and supplied to the circuit 5.

The signal Pri__Inc, or a signal derived therefrom, is also supplied to a detection circuit 90 which provides for the generation of two signals EV__EQ and OD__EQ that can be activated mutually exclusively in order to start precharging activities in the reading circuits of the two memory banks 31, 32. The circuit 90 also generates a further signal EQ__Det, which is supplied, together with the signals Pri__EV, Pri__OD, to a control block of the switches 9.

The memory 2 also comprises a series of internal timing circuits; these circuits are indicated schematically by the block 70 (TIMING) of FIG. 2, which receives the external signals RD, PG. CS that are generated under the control of the microprocessor 1. The timing circuits 70 provide for the generation of a suitable timing signal Du__LD which is supplied to the circuit 60 in order to synchronize the generation of the increment signal Inc and of the pulsed signal Pri__Inc. The timing circuits 70 generate a further timing signal LD which is supplied to the driver circuits 11 of the lines of the data bus Data__bus to permit the loading of the datum present in the array of latches 10 into the driver circuits. A further signal Wait, generated by the timing circuits 70, is supplied to an input line stop of the circuit 60 to suspend the generation of the signals Inc and Pri__Inc.

Still with reference to FIG. 2, the memory 2 comprises circuits, schematically indicated by a block 80 (Recovery&Resume), which monitor the state of the enabling signal CS. The circuits of the block 80 generate a pair of signals Rec and Res, which are supplied to the timing circuits 70. In the timing circuits 70, the generation of the signals LD, Du__LD and Wait is conditional upon the states of the signals Rec and Res, in the manner which will be described further below.

The memory described above operates in the following manner.

The memory can perform various types of reading, in dependence on the states of the control signals CS, ALE and RD supplied to the memory by the microprocessor.

A first type of reading, known as "random-access reading" provides for an access to the memory with a random address which cannot be predicted by the memory and which is supplied thereto from the exterior, that is, the reading of an unpredictable address location pointed to directly from the exterior. The memory recognizes a request for access of this type by the fact that the signal CS is at low logic level, a pulse of predetermined duration is produced on the signal ALE, and the signal RD undergoes a "1"->"0" transition.

A second type of reading, known as "sequential reading" ("Burst") provides, after a random-access reading, for access, in sequence, to consecutive locations which are addressed by the internal addressing structure of the memory. The signals CS and ALE are kept at the low logic level and only the signal RD varies; the memory supplies the new datum read upon the "0"->"1" transition of the signal RD. The signal RD thus acts as a timing signal.

A third type of reading, known as "resume reading" takes place when the memory returns from the standby condition (signal CS switches from "1" to "0") with the signal ALE at low logic level. In this case, the memory transfers the last valid datum read to the output.

A particular characteristic of the architecture according to the invention lies in the capability to perform a sequential ("Burst") reading. As already mentioned, this term is intended to define herein a method of reading in which, after an address of a starting or origin memory location, that is, a memory location from which to start performing the reading, has been supplied to the memory from the exterior, the memory can autonomously output the contents of the memory locations succeeding the starting location, without the need to wait for the addresses of these successive memory locations to be supplied from the exterior.

Figure 3A:
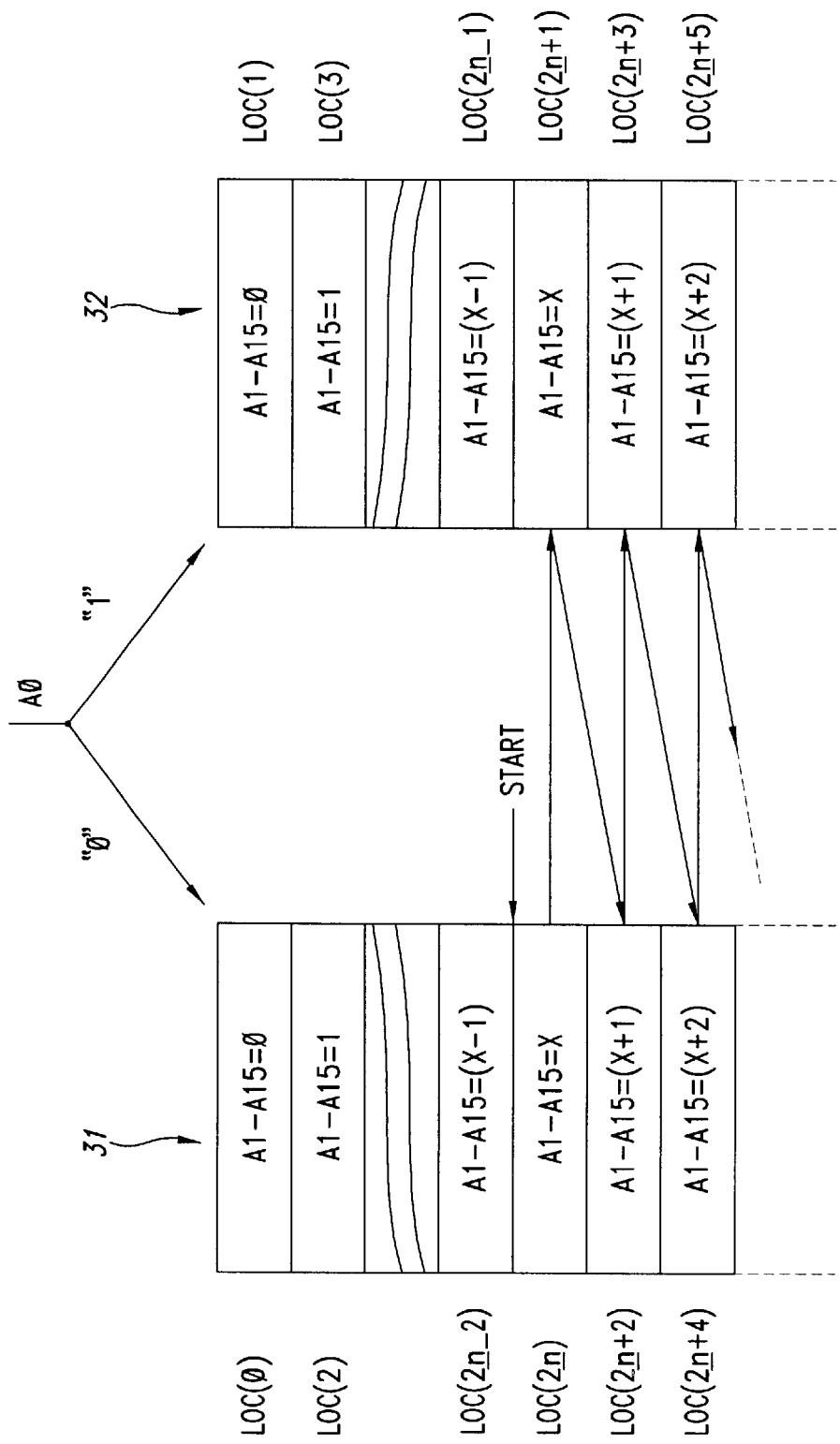

In other words, and with reference to FIG. 3A, upon the assumption that an initial address corresponding to the memory location LOC(2n) is supplied to the memory from the exterior, the memory outputs the content of the location LOC(2n) and then, in sequence, the contents of the locations LOC(2n+1), LOC(2n+2), etc., uninterruptedly, until the microprocessor stops the sequential reading.

Advantageously, by virtue of the architecture described, the execution of a sequential reading by the memory proceeds in accordance with an interleaved method, by accessing in sequence consecutive locations in the memory address space which belong alternately to one or to the other of the two memory banks. This takes place in a manner such that the external system is completely unaffected.

In particular, after the microprocessor has placed a new address corresponding to the starting memory location for the sequential reading on the addressing-line bus and has turned on the signal ALE to indicate to the memory that a new valid address is present on the bus ADD, the memory proceeds as follows.

The new address present on the bus ext_Add_bus is loaded into both of the counters 41, 42. More specifically, the configuration present on the lines A1–A15 of the bus is loaded into the two counters. The signal A0, on the other hand, is used by the memory to determine to which of the two memory banks 31, 32 the memory location initially addressed by the microprocessor, or starting memory location, belongs.

In other words, the logic state on the line A0 determines the selection of one or of the other of the two memory banks 31, 32. This selection takes place solely at the beginning of a sequential reading when the signal ALE is turned on, after which the memory becomes insensitive to the states of the external addressing signals.

With reference to FIG. 3A, it is thus assumed, for clarity of explanation, that the memory bank 31 contains the memory locations LOC(2n) in which n is a whole number, with even addresses (that is, those locations all of which have addresses in which A0="0"), and the memory bank 32 contains the memory locations LOC(2n+1) with odd addresses (with A0="1"). It is also assumed that the initial address placed on the bus by the microprocessor is an even address, that is, that A0="0"; this address corresponds to a memory location LOC(2n) belonging to the memory bank 31 of the even address locations. Clearly, each individual combination of the signals A1–A15 identifies two memory locations, one belonging to the bank 31 and the other belonging to the bank 32; the signal A0, however, identifies the memory bank: A0="0"-> memory bank 31, A0="1"-> memory bank 32.

After the address A1–A15>=x of the starting location has been loaded into both of the counters, the memory reads the content of the memory location LOC(2n) initially addressed.

When the starting location LOC(2n) has been read, the memory autonomously reads the successive memory locations in sequence, changing alternately from one memory bank to the other.

In particular, after the location LOC(2n) has been read, the memory arranges for the content of the counter 41 to be increased by one so that the counter 41 will contain the address A1–A15=(x+1) of the location which immediately follows the starting location in the bank 31 and which corresponds to the location LOC(2n+2).

At the same time, the memory starts the reading of the location A1–A15=x of the bank 32 which corresponds to the location LOC(2n+1) with an odd address and immediately following the location previously read in the address space. The address of this location is already contained in the counter 42 since the location LOC(2n+1) shares the portion A1–A15 of the address signals with the starting location.

Similarly, after the reading of the location LOC(2n+1) has been completed, the memory provides for the content of the counter 42 to be increased by one so that the counter 42 will contain the address A1–A15=(x+1) of the location immediately following the location LOC(2n+1) just read in the bank 32 and corresponding to the location LOC(2n+3). At the same time, the memory starts the reading of the location LOC(2n+2) of the bank 31, the address of which is already contained in the counter 41.

In the absence of a stop command by the microprocessor, the memory continues in this manner indefinitely, scanning the entire address space of the memory, alternating the memory bank on which to perform the reading upon each reading. The content of the counter associated with the memory bank to which the memory location just read belongs is immediately increased upon completion of the reading. Upon the completion of each reading (which condition occurs upon each "0"->"1" transition of the external signal RD), the operations to update the contents of the counters are suspended (the Wait signal is turned on). The memory leaves this condition of suspension of memory-updating activities if and only if the signal RD is returned to logic level "0". If this condition has not occurred, or is delayed in occurring, the configurations of the counters and the data resulting from the last reading performed are frozen. The progression of the memory thus proceeds in harmony with the processing of the data by the microprocessor. The memory proceeds in this autonomous, interleaved, sequential method of reading the two memory banks until the microprocessor turns on the signal ALE again, indicating to the memory that a new address of a location to be read has been placed on the external addressing signal bus.

Figure 3B:
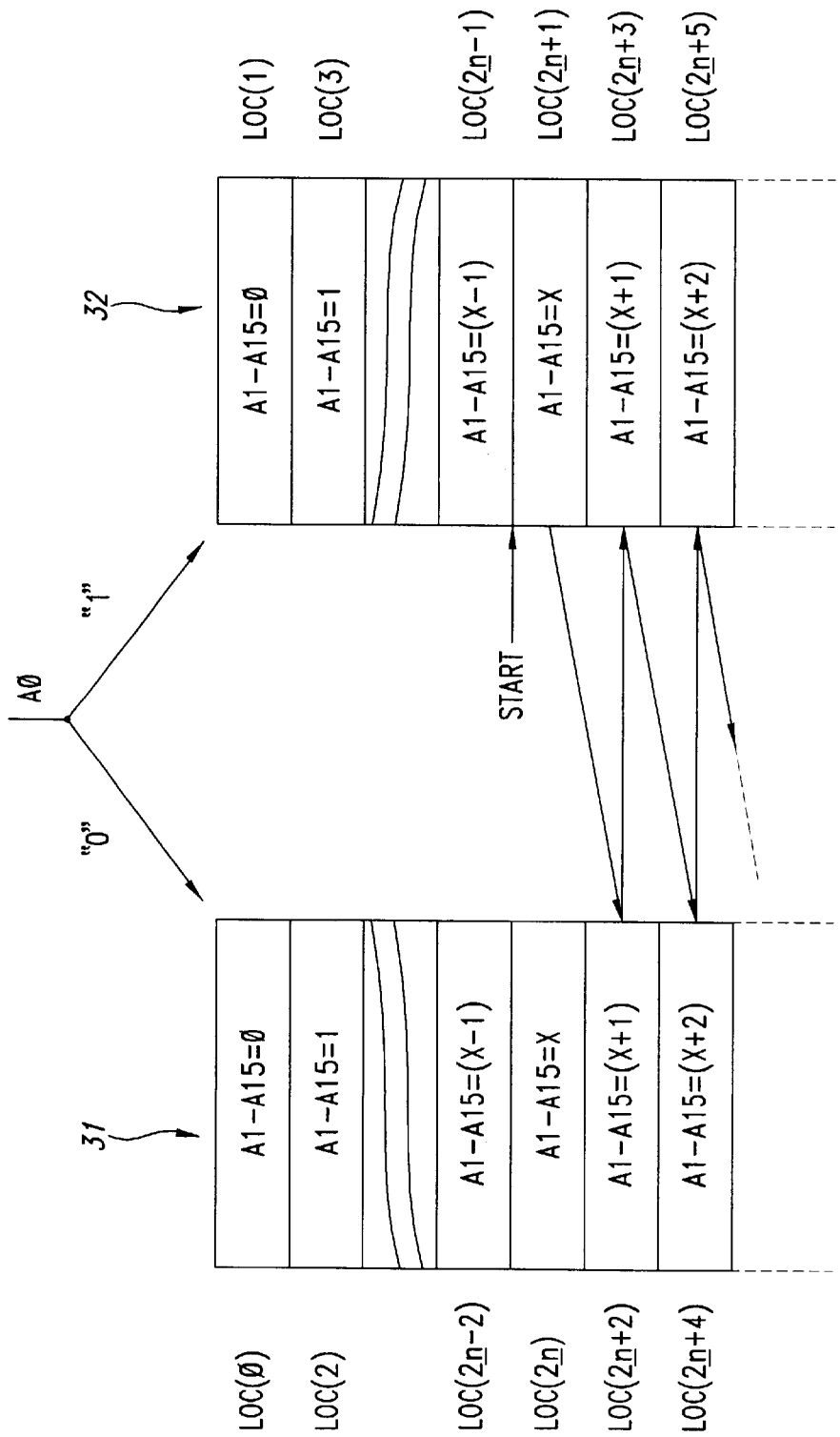

FIG. 3B is similar to FIG. 3A but relates to the situation in which the starting or origin location LOC(2n+1) has an odd address, that is A0="1". In this case, after the address A1–A15=x of the starting location has been loaded into both of the counters 41, 42, the memory detects that an odd location is involved and brings about an immediate increment of 1 of the content of the counter 41 associated with the bank 31 of even address locations which will contain the address A1–A15=(x+1). At the same time, the memory reads the content of the starting location LOC(2n+1). When the starting location LOC(2n+1) has been read, the memory arranges for the content of the counter 42 to be increased by one so that the counter 42 will thus contain the address A1–A15=(x+1) of the location which immediately follows the starting location in the bank 32 and which corresponds to the location LOC(2n+3). At the same time, the memory starts the reading of the location A1–A15=(x+1) of the bank 31 corresponding to the location LOC(2n+2) of even address and immediately following the location previously read in the address space. The reading then proceeds uninterruptedly in a manner similar to that described above, until the microprocessor stops it.

Figure 4A:
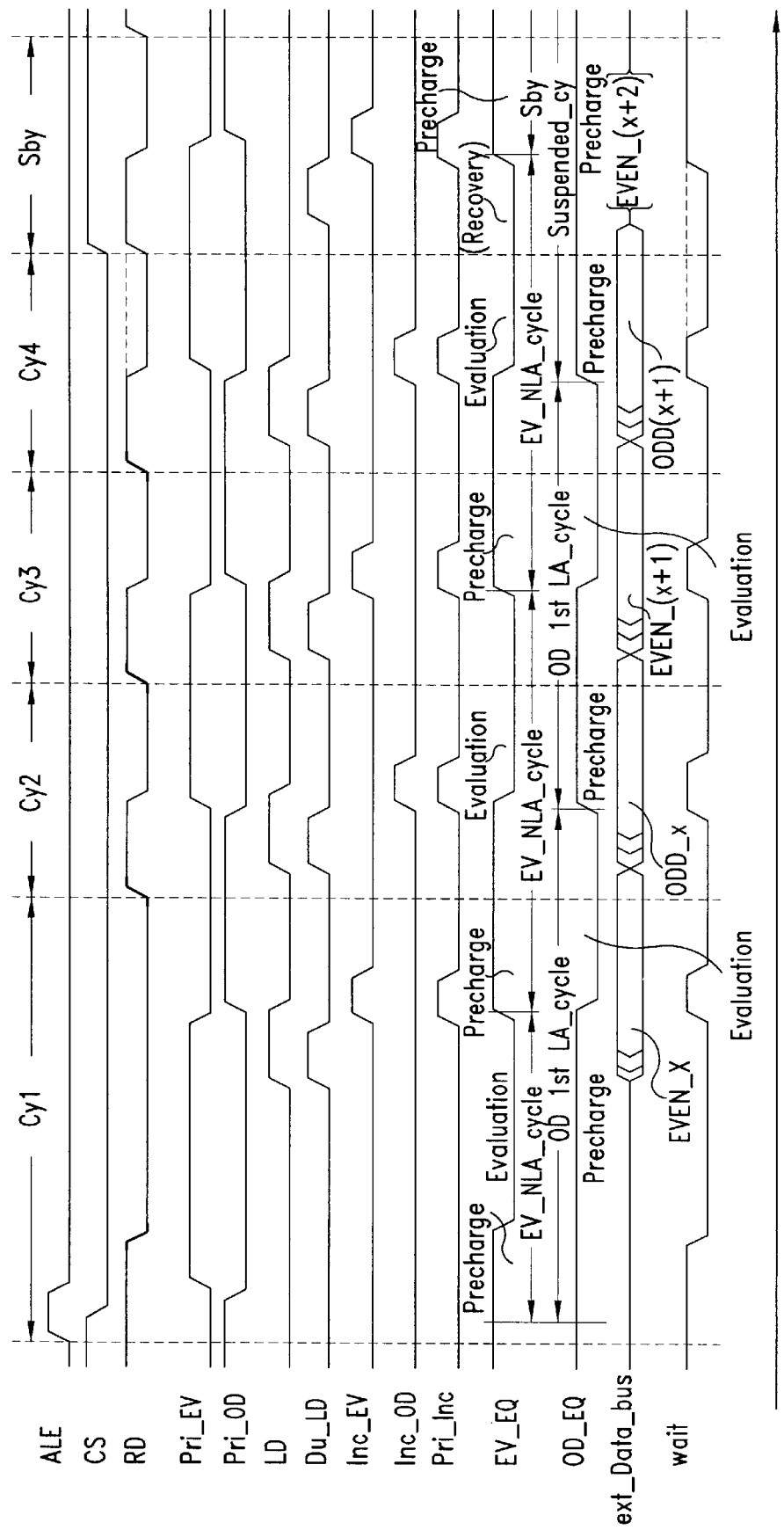
FIGS. 4A and 4B show the development, over time, of the most significant signals in the operation of the memory.
Figure 4B:
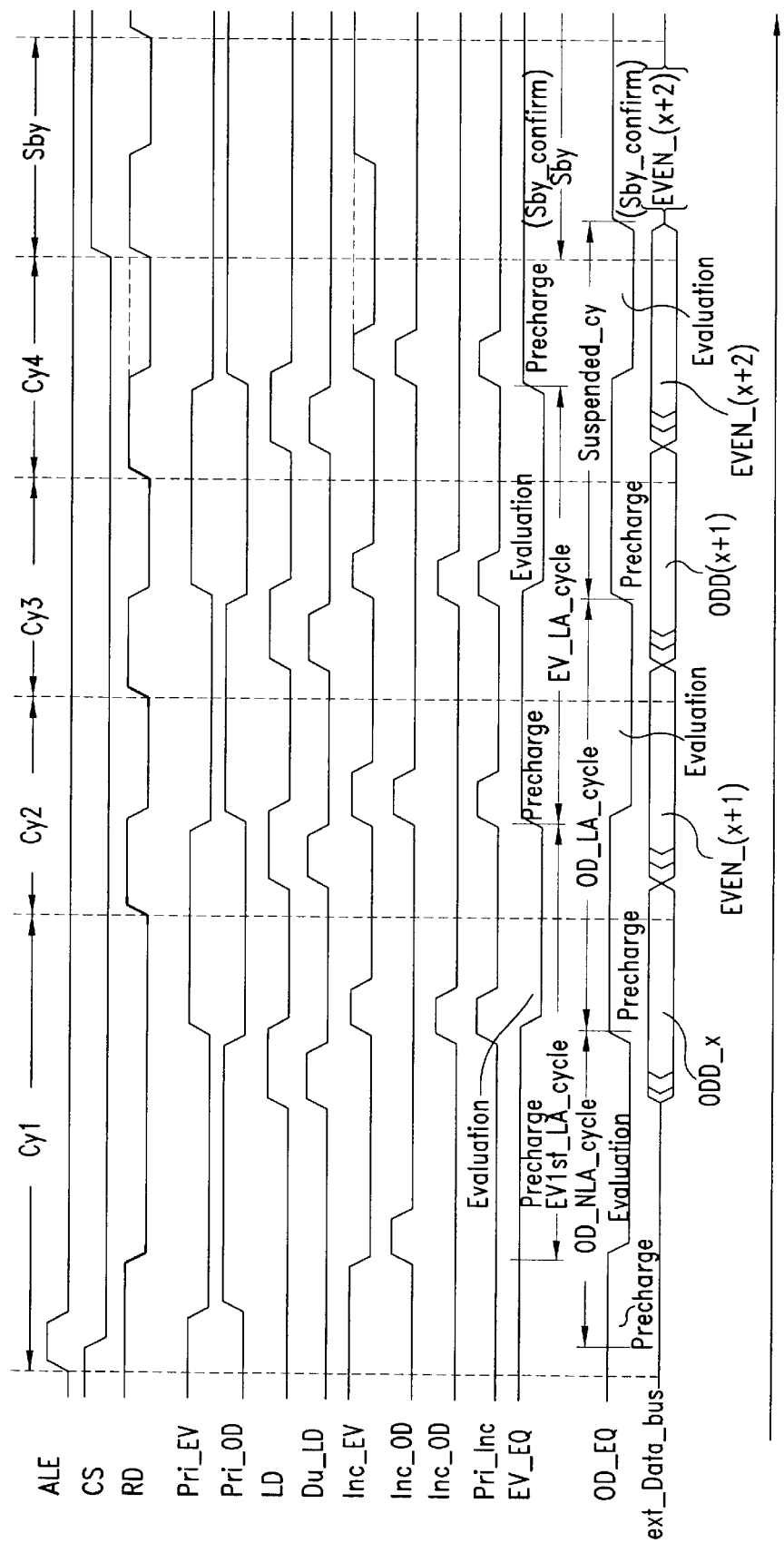

With reference to FIGS. 4A and 4B (which represent the situations of FIGS. 3A and 3B, respectively, in the form of time graphs of the most significant signals), CY1 is a cycle for the reading of the starting or origin location, CY2, CY3, CY4 are cycles for the sequential reading of the locations which follow the starting location, Sby is a period of time in which the memory is put in the standby condition, EVEN_x, ODD_x, EVEN_(x+1), ODD_(x+1) indicate the contents of the even and odd address locations A1–A15=x and A1–A15=(x+1), respectively, and EVEN_(x+2) is the content of the even address location A1–A15=(x+2).

The memory architecture according to the invention enables two reading processes to be started in the two memory banks, in parallel but by an interleaved method, starting from a generic starting or origin location. This method has the following characteristics: at any moment, two reading processes, one per bank, are in progress, the activities which affect the two banks are complementary: whilst the precharging activity is in progress in one bank, the datum-evaluation activity is in progress in the second bank, and vice versa. This technique considerably improves immunity to noise, since the reading of the data by the reading circuits of one bank takes place definitely after switching, which generates considerable interference in the supply and reference voltages of the output buffer circuits. The reading and evaluation of the data by the reading circuits is thus performed in the absence of noise. The address of the starting location is loaded into the two counters simultaneously; if the address of the starting location is odd, the counter associated with the bank of even locations is updated (increased by one) immediately after the starting address has been loaded (signal Inc_EV in the cycle CY1 of FIG. 4B). The current bank is identified by the circuit 5 which, at the beginning of a sequential reading, is set in accordance with the state of the address signal A0; the circuit 5 is subsequently updated (signal Pri_Inc) in "toggle" manner by the increment circuit 60 upon each increment pulse of the counters (Inc_EV, Inc_OD), which is produced upon completion of a reading. The updating of the circuit 5 brings about the exchange of roles between the two memory banks.

Each reading of a starting or origin location starts upon the falling edge of the signal RD, as in a normal random-access reading. Upon completion of each reading of the starting location, the memory performs: an increment of the counter associated with the block just read (signal Inc_EV, signal Inc_OD), the exchange of roles between the two banks by means of the circuit 5 (signal Pri_Inc), the arrangement of the bank just read in the precharging state, and the arrangement of the other bank in the evaluation state.

During a sequential reading, after the reading of the starting location, each reading of the successive locations starts upon the rising edge of the signal RD. Upon completion of each reading, the memory performs: an increment of the counter associated with the block just read (by means of the signals Inc_EV, Inc_OD), an exchange of roles between the memory banks by means of the circuit 5 and its updating signal Pri_Inc, the arrangement of the bank just read in the precharging state (signals EV_EQ, EV_OD), and the arrangement of the other bank in the evaluation state.

The data bus Int_bus within the memory is assigned alternately to one or to the other of the two memory banks in accordance with a time-sharing method consistent with the protocol which provides for the signal RD to be brought to the low logic level; this makes it possible to have a single structure for transferring the data read by both of the memory banks to the output. The datum output by the memory is updated solely upon the activation (closure) of the switches 9 controlled by the block EV/OD-ok. The activation of the switches 9 takes place solely if the signal RD has been brought to logic level "0"; this condition in fact makes way for the procedure for updating the data in the output buffer circuits. The pulse LD enables the data loaded in the output buffer circuits to be made available on the external data bus and is always accompanied by the pulse Du_LD which causes the increment circuit 60 to generate an increment pulse on the signal Inc for the increment of the counter associated with the bank just read, and on the signal Pri_Inc for the updating of the circuit 5 for selecting the memory bank. The updating of the content of the register 10, which is brought about by the signals generated by the block EV/OD_ok, and the making available of the data loaded in the output buffers on the external data bus, which is brought about by the signal LD, take place at distinct moments spaced apart in time. The fact that the increment circuit 60 is controlled by the signal Du_LD and not by the signal LD makes it possible to perform the increment activities even during "recovery" stages when the signal LD is inhibited (FIG. 4A).

At the end of each increment pulse, the counter-updating activities are suspended (by bringing the signal Wait to "1") and are then restarted (by bringing the signal Wait back to "0") if, and only if, the signal RD is brought to logic level "0". This enables the progression of the memory to be synchronized with the progression of the microprocessor.

When the memory is disabled (signal CS), if the signal RD is at low logic level at the moment at which the memory receives the deactivation request, effective entry into the "standby" condition is deferred relative to the moment at which the transition in the signal CS takes place, by a period of time long enough to allow the memory to perform a recovery of the result of the last reading started ("recovery" stage). During the recovery stage, the pulse on the signal LD is not generated since the datum read cannot be supplied to the microprocessor.

If, at the moment of entry into standby ("0"->"1" transition of the signal CS), the signal RD has never been brought to logic level "0", neither the pulse LD nor the pulse Du_LD are generated (FIG. 4B). Thus, an increment pulse is not produced and, in addition, no "recovery" activity is performed. However, the configuration relating to the last reading performed is frozen.

The transfer of the data read from a selected location of a bank to the bank of registers 10 is brought about by the signal RD (in particular by the "1"->"0" transition of the signal RD). The datum currently present in the bank of registers 10 is made available on the external data bus upon the "0"->"1" transition of the signal RD, or upon the "1"->"0" transition of the signal CS when the memory is in sequential reading mode, or solely by the "1"->"0" transition of the signal RD when the memory is in random-access (conventional) reading mode.

For reading of consecutive locations in sequence, the memory architecture according to the present invention thus provides for two reading processes which progress in parallel but in a suitably complementary manner, in accordance with the interleaved method. As shown by the time graphs of FIGS. 4A, 4B, the time of each sequential reading cycle (CY2, CY3, CY4) is substantially halved in comparison with the cycle time (CY1) for a random-access reading; this is by virtue of the fact that all of the preparatory activities for the reading of a location (its selection, precharging of the circuits, etc.) start whilst the preceding cycle is still in progress (EV LA_cycle, that is, sequential reading of an even location and OD LA_cycle, sequential reading of an odd location, are partially superimposed and suitably offset in time). The sequential reading may be interrupted by the microprocessor at any moment, either by putting the memory in standby conditions, or by supplying an address of a new location to the memory. In the event of such an interruption, the reading process which is in progress in the memory location with the subsequent address, and which has already started, is interrupted.

In comparison with known memory architectures which permit "page mode" readings, the architecture of the invention has the advantage of not having any limit on the number of memory locations which can be read in sequence; it is even possible to read the entire memory sequentially, with considerable saving of time. Moreover, in the event of temporary deactivation of the memory (standby), when the memory returns from this condition, it is possible to continue the sequential reading from the point at which it was interrupted, thus giving rise to a "resume" activity, without loss of time.

The architecture described renders the memory compatible with a use which provides for conventional operation. In fact, if the signal ALE is kept indefinitely at logic level "1", the counters maintain the same configuration, thus pointing to two corresponding locations in the respective memory banks; the selection of the location is made on the basis of the logic state of the signal A0.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A semiconductor memory architecture comprising:

two memory banks each containing respective memory locations;

for each memory bank, respective circuits for selecting the memory locations in the memory bank and respective circuits for reading the data contained in the selected memory locations in the memory bank, a structure for the transfer of the data read by the reading circuits associated with the memory banks to data output terminals of the memory, comprising a single data-transfer structure that can be assigned selectively to one memory bank at a time and that comprises storage means for storing the most recent datum read by the reading circuits, and output driver circuits that can be activated selectively in order to transfer the contents of the registers to the data output terminals of the memory;

an addressing structure comprising, for each memory bank, a respective circuit for the sequential scanning of the memory locations of the memory bank, operatively connected to the respective circuits for selecting the locations of the memory bank;

first circuit means for initializing the sequential scanning circuits by means of an address supplied from outside the memory and corresponding to an origin location, the first circuit means being sensitive to a first control signal from outside the memory and indicative of the presence of the address corresponding to the origin location, second circuit means for bringing about a selective updating of the sequential scanning circuits so as to bring about, starting from the origin location, sequential access to further locations addressed by the addressing structure by accessing the two memory banks alternately, by an interleaved method, third circuit means for managing the reading circuits of the two memory banks in accordance with the interleaved method so that two reading processes are executed contemporaneously, but offset in time, in the two memory banks, fourth circuit means for bringing about the selective assignation of the data-transfer structure to the memory bank currently being accessed, in accordance with the interleaved method, and an internal timing structure for controlling the first, second, third and fourth circuit means, the data-transfer structure, and the addressing structure in accordance with second control signals from outside the memory.

2. The memory architecture of claim 1, further comprising fifth circuit means for bringing about completion of the reading in progress and recovery of the last datum read in the storage means upon an external command for disablement of the memory, and for bringing about resumption of the activity of the memory upon the return of the memory from the disablement condition.

3. The memory architecture of claim 2 in which the data-transfer structure comprises a single internal data bus of data-transfer lines, a single register connectible to the internal data bus for the holding storage of the most recent datum read by the reading circuits, means for the selective connection of the internal data bus to the register, and circuits for driving a data bus from outside the memory, the circuits operatively associated with the register and configured to be activated selectively in order to receive the datum read from the register and to transfer it on the data bus outside the memory.

4. The memory architecture of claim 3 in which the fourth circuit means comprise switching means for the selective connection of the lines of the single internal data bus to respective output bus lines of the reading circuits associated with one or with the other of the two memory banks.

5. The memory architecture of claim 4 in which the activation of the driver circuits is controlled by the timing structure.

6. The memory architecture of claim 4 in which the activation of the driver circuits is prevented if the memory is put in "standby" conditions.

7. The memory architecture of claim 6 in which the addressing structure comprises a respective counter for each memory bank.

8. The memory architecture of claim 7 in which the first circuit means comprise means for the selective connection of each of the two counters to lines of an address bus that can carry the address supplied from outside the memory, and an initialization circuit to control the means for the selective connection of the counters to the address bus, the initialization circuit configured to connect the counters to the address bus upon the activation of the first control signal outside the memory.

9. The memory architecture of claim 8 wherein the initialization circuit is configured to perform a filtering of the first control signal outside the memory to prevent undesired loading of spurious addresses into the counters.

10. The memory architecture of claim 9 in which the second circuit means comprise a circuit for generating a pulsed updating signal, for each memory bank a respective circuit for generating a signal for the conditional updating of the respective sequential scanning circuit, and a circuit for controlling the interleaved access to the two memory banks, which circuit generates updating enablement signals that are supplied to the conditional updating signal generators, the control circuit determining the correct sequence of activation of the updating enablement signals on the basis of the address of the origin location.

11. The memory architecture of claim 10 in which the circuit for generating the pulsed updating signal is controlled by the internal timing structure.

12. The memory architecture of claim 11 in which, after each reading of a memory location of one or of the other memory bank, the timing structure causes the circuit for generating the updating signal to bring about a suspension of the updating signal whilst awaiting an external control signal.

13. The memory architecture of claim 12 in which the control of the circuit for generating the increment signal by the timing structure is independent of but substantially simultaneous with the control of the activation of the driver circuits by the timing structure.

14. The memory architecture of claim 13 in which the timing structure causes the circuit for generating the updating signal to generate the updating signal even when the memory is put in standby after the execution of the last reading.

15. The memory architecture of claim 14 in which the means for the selective connection of the internal data bus to the register are activated upon the control of the increment signal which in turn is turned on after the timing structure has detected an external control signal.

16. The memory architecture of claim 15 in which the circuit for controlling interleaved access operates by detecting the state of a least significant bit of the address of the origin location, which determines the memory bank to which the location to be read firstly belongs and, subsequently, by bringing about access to a sequence of locations belonging alternately to one or to the other of the two memory banks in synchronism with a timing signal generated by the circuit for generating the pulsed updating signal.

17. The memory architecture of claim 16 in which, after the circuit for controlling the interleaved access has determined the memory bank to which the origin location belongs by detecting the state of the least significant bit of the address of the origin location, it is updated autonomously to bring about access to the sequence of locations belonging alternately to one or to the other of the two memory banks, becoming unaffected by the state of the least significant bit of the address present on the address bus.

18. The memory architecture of claim 17 in which the circuit for controlling the interleaved access brings about the assignation of the data-transfer structure to one or to the other of the two memory banks alternately and in accordance with the interleaved access method.

19. The memory architecture of claim 18 in which the addressing structure further comprises, for each memory bank, respective redundancy circuits for the selection of redundancy memory locations in the respective bank in functional replacement of defective locations of the memory bank.

20. A semiconductor memory architecture, comprising:
first and second memory banks, each memory bank containing memory locations, selection circuits for selecting the memory locations in the memory bank, and reading circuits for reading data contained in the selected memory locations in each memory bank;
a bus configured to transfer data read by the reading circuits from the first and second memory banks to data output terminals;
an addressing structure comprising, for each memory bank, a respective circuit for the sequential scanning of the memory locations in each memory bank and operatively connected to the respective circuits for selecting the memory locations in the memory banks;
a first circuit for initializing the sequential scanning circuits by an external address and corresponding to an origin location, the first circuit configured to respond to a first external control signal that is indicative of the presence of an address corresponding to the origin location;
a second circuit configured to initiate selective updating of the sequential scanning circuits starting from the original location and sequentially accessing further memory locations addressed by the addressing structure by accessing the two memory banks alternatingly by an interleaved method;
a third circuit for managing the reading circuits of the two memory banks and according with an interleaved method such that reading of each memory bank is executed contemporaneously but offset in time;
a fourth circuit configured to selectively connect the bus to the memory bank currently being read in accordance with the interleaved method; and
an internal timing structure for controlling the first, second, third, and fourth circuits, the bus, and the addressing structure in accordance with second external control signals; and
a fifth circuit configured to recover the last data read at the completion of reading upon receipt of an external command for disablement, and for resuming reading of the memory upon cessation of the external command for disablement.

21. A semiconductor memory architecture, comprising:
first and second memory banks, each memory bank containing memory locations, selection circuits for selecting the memory locations in the memory bank, and reading circuits for reading data contained in the selected memory locations in each memory bank;

a bus configured to transfer data read by the reading circuits from the first and second memory banks to data output terminals, wherein the bus comprises a single internal data bus of data-transfer lines, a single register connectible to the internal data bus for storing the most recent data read by the reading circuits, means for selectively connecting the internal data bus to the register, and driving circuits configured to drive external data busses and operatively associated with the register, and configured to be activated selectively in order to receive the data read from the register and to transfer to the external data bus;

an addressing structure comprising, for each memory bank, a respective circuit for the sequential scanning of the memory locations in each memory bank and operatively connected to the respective circuits for selecting the memory locations in the memory banks;

a first circuit for initializing the sequential scanning circuits by an external address and corresponding to an origin location, the first circuit configured to respond to a first external control signal that is indicative of the presence of an address corresponding to the origin location;

a second circuit configured to initiate selective updating of the sequential scanning circuits starting from the original location and sequentially accessing further memory locations addressed by the addressing structure by accessing the two memory banks alternatingly by an interleaved method;

a third circuit for managing the reading circuits of the two memory banks and according with an interleaved method such that reading of each memory bank is executed contemporaneously but offset in time;

a fourth circuit configured to selectively connect the bus to the memory bank currently being read in accordance with the interleaved method;

a fifth circuit configured to recover the last data read at the completion of reading upon receipt of an external command for disablement, and for resuming reading of the memory upon cessation of the external command for disablement; and an internal timing structure for controlling the first, second, third, and fourth a circuits, the bus, and the addressing structure in accordance with second external control signals.

22. A semiconductor memory architecture, comprising:

first and second memory banks, each memory bank containing memory locations, selection circuits for selecting the memory locations in the memory bank, and reading circuits for reading data contained in the selected memory locations in each memory bank;

a bus configured to transfer data read by the reading circuits from the first and second memory banks to data output terminals, wherein the bus comprises a single internal data bus of data-transfer lines, a single register connectible to the internal data bus for storing the most recent data read by the reading circuits, means for selectively connecting the internal data bus to the register, and driving circuits configured to drive external data busses and operatively associated with the register, and configured to be activated selectively in order to receive the data read from the register and to transfer to the external data bus;

an addressing structure comprising, for each memory bank, a respective circuit for the sequential scanning of the memory locations in each memory bank and operatively connected to the respective circuits for selecting the memory locations in the memory banks;

a first circuit for initializing the sequential scanning circuits by an external address and corresponding to an origin location, the first circuit configured to respond to a first external control signal that is indicative of the presence of an address corresponding to the origin location;

a second circuit configured to initiate selective updating of the sequential scanning circuits starting from the original location and sequentially accessing further memory locations addressed by the addressing structure by accessing the two memory banks alternatingly by an interleaved method;

a third circuit for managing the reading circuits of the two memory banks and according with an interleaved method such that reading of each memory bank is executed contemporaneously but offset in time;

a fourth circuit configured to selectively connect the bus to the memory bank currently being read in accordance with the interleaved method, wherein the fourth circuit comprises switching means for the selective connection of the lines of the internal data bus to respective output bus lines of the reading circuits associated with each of the two memory banks;

a fifth circuit configured to recover the last data read at the completion of reading upon receipt of an external command for disablement, and for resuming reading of the memory upon cessation of the external command for disablement; and an internal timing structure for controlling the first, second, third, and fourth circuits, the bus, and the addressing structure in accordance with second external control signals.

* * * * *

UNITED STATES PATENT AND TRADEMARK OFFICE
CERTIFICATE OF CORRECTION

PATENT NO.     : 6,580,637 B2  
DATED          : June 17, 2003  
INVENTOR(S)    : Luigi Pascucci It is certified that error appears in the above-identified patent and that said Letters Patent is hereby corrected as shown below:

<u>Title page,</u>
Item [30], Foreign Application Priority Data, should read -- MI00A2165 --.

Signed and Sealed this

Twenty-first Day of October, 2003

JAMES E. ROGAN
*Director of the United States Patent and Trademark Office*